United States Patent
Shi et al.

(10) Patent No.: US 9,305,806 B2
(45) Date of Patent: Apr. 5, 2016

(54) CHEMICAL MECHANICAL POLISHING SLURRY COMPOSITIONS AND METHOD USING THE SAME FOR COPPER AND THROUGH-SILICON VIA APPLICATIONS

(71) Applicant: AIR PRODUCTS AND CHEMICALS, INC., Allentown, PA (US)

(72) Inventors: Xiaobo Shi, Chandler, AZ (US); Krishna Murella, Phoenix, AZ (US); James Allen Schlueter, Phoenix, AZ (US); Jae Ouk Choo, Chandler, AZ (US)

(73) Assignee: Air Products and Chemicals, Inc., Allentown, PA (US)

(*) Notice: Subject to any disclaimer, the term of this patent is extended or adjusted under 35 U.S.C. 154(b) by 2 days.

(21) Appl. No.: 14/598,472

(22) Filed: Jan. 16, 2015

(65) Prior Publication Data

US 2015/0132956 A1    May 14, 2015

Related U.S. Application Data

(62) Division of application No. 13/929,346, filed on Jun. 27, 2013, now Pat. No. 8,974,692.

(51) Int. Cl.

| | |
|---|---|
| *H01L 21/302* | (2006.01) |
| *H01L 21/321* | (2006.01) |
| *B24B 1/00* | (2006.01) |
| *H01L 21/306* | (2006.01) |
| *H01L 21/768* | (2006.01) |
| *C09G 1/00* | (2006.01) |
| *C09G 1/04* | (2006.01) |
| *C09G 1/06* | (2006.01) |
| *C09K 13/06* | (2006.01) |
| *C09K 3/14* | (2006.01) |
| *C09G 1/02* | (2006.01) |

(52) U.S. Cl.
CPC .............. *H01L 21/3212* (2013.01); *B24B 1/00* (2013.01); *H01L 21/30625* (2013.01); *H01L 21/76898* (2013.01); *C09G 1/00* (2013.01); *C09G 1/02* (2013.01); *C09G 1/04* (2013.01); *C09G 1/06* (2013.01); *C09K 3/1409* (2013.01); *C09K 3/1463* (2013.01); *C09K 13/06* (2013.01)

(58) Field of Classification Search
None
See application file for complete search history.

(56) References Cited

U.S. PATENT DOCUMENTS

| | | |
|---|---|---|
| 5,770,095 A | 6/1998 | Sasaki et al. |
| 6,436,811 B1 | 8/2002 | Wake et al. |
| 6,440,186 B1 | 8/2002 | Sakai et al. |
| 6,585,568 B2 | 7/2003 | Tsuchiya et al. |
| 6,679,929 B2 | 1/2004 | Asano et al. |
| 6,838,016 B2 | 1/2005 | Sakai et al. |
| 8,974,692 B2 * | 3/2015 | Shi ............... H01L 21/30625 16/53 |
| 2002/0096659 A1 | 7/2002 | Sakai et al. |
| 2005/0009714 A1* | 1/2005 | Chen et al. ........... 508/591 |
| 2006/0252268 A1* | 11/2006 | Chopra et al. ........ 438/692 |
| 2007/0167017 A1 | 7/2007 | Uchida et al. |

(Continued)

*Primary Examiner* — Jiong-Ping Lu
(74) *Attorney, Agent, or Firm* — Lina Yang

(57) ABSTRACT

Provided are novel chemical mechanical polishing (CMP) slurry compositions for polishing copper substrates and method of using the CMP compositions. The CMP slurry compositions deliver superior planarization with high and tunable removal rates and low defects when polishing bulk copper layers of the nanostructures of IC chips. The CMP slurry compositions also offer the high selectivity for polishing copper relative to the other materials (such as Ti, TiN, Ta, TaN, and Si), suitable for through-silicon via (TSV) CMP process which demands high copper film removal rates.

11 Claims, 3 Drawing Sheets

(56) References Cited

U.S. PATENT DOCUMENTS

| | | | |
|---|---|---|---|
| 2008/0170979 A1* | 7/2008 | Wang et al. ................... 423/335 |
| 2009/0156006 A1 | 6/2009 | Anjur et al. |
| 2009/0261291 A1* | 10/2009 | Banerjee et al. ............. 252/79.1 |
| 2010/0081279 A1 | 4/2010 | Palmer et al. |
| 2011/0118165 A1* | 5/2011 | Lee ................................ 510/176 |

* cited by examiner

CHEMICAL MECHANICAL POLISHING SLURRY COMPOSITIONS AND METHOD USING THE SAME FOR COPPER AND THROUGH-SILICON VIA APPLICATIONS

CROSS REFERENCE TO RELATED APPLICATIONS

The present patent application is a divisional application of U.S. patent application Ser. No. 13/929,346 which was filed on Jun. 27, 2013 (now U.S. Pat. No. 8,974,692 issued on Mar. 10, 2015).

BACKGROUND OF THE INVENTION

This invention is in the field of copper and through-silicon via (TSV) chemical mechanical polishing (CMP). More specifically, it is related to the CMP slurry compositions and method of using the slurry compositions.

The use of chemical mechanical planarization (CMP) in semiconductor manufacturing is well known to those of skill in the art. For example, CMP processing can be used to remove excess metal, such as copper, used to form interconnects, vias and lines. Work has been done in the field of the invention.

U.S. Pat. No. 6,436,811 discloses a process for forming a metal interconnect comprising the steps of forming a concave in an insulating film formed on a substrate, forming a copper containing metal film over the whole surface such that the concave is filled with the metal and then polishing the copper-containing metal film by chemical mechanical polishing, characterized in that the polishing step is conducted using a chemical mechanical polishing slurry comprising a polishing material, an oxidizing agent and an adhesion inhibitor preventing adhesion of a polishing product to a polishing pad, while contacting the polishing pad to a polished surface with a pressure of at least 27 kPa. This invention allows us to prevent adhesion of a polishing product to a polishing pad and to form a uniform interconnect layer with an improved throughput, even when polishing a large amount of copper-containing metal during a polishing step.

U.S. Pat. No. 5,770,095 provides a polishing method including the steps of forming a film made of material containing a metal as a main component over a substrate having depressed portions on a surface thereof so as to fill the depressed portions with the film, and polishing the film by a chemical mechanical polishing method using a polishing agent containing a chemical agent responsible for forming a protection film on a surface of the film by reacting with the material containing a metal as a main component, thereby forming a conductive film in the depressed portions. U.S. Pat. No. 5,770,095 also provides a polishing agent, which is used in forming a film made of material containing a metal as a main component in depressed portions of a substrate having depressed portions on a surface thereof by using a chemical mechanical polishing method, including a chemical agent responsible for forming a protection film on the surface of a substrate to be polished by reacting with the material containing a metal as a main component.

U.S. Pat. No. 6,585,568 provides a chemical mechanical polishing slurry for polishing a copper-based metal film formed on an insulating film comprising a concave on a substrate, comprising a polishing material, an oxidizing agent and water as well as a benzotriazole compound and a triazole compound. The polishing slurry may be used in CMP to form a reliable damascene electric connection with excellent electric properties at a higher polishing rate, i.e., a higher throughput while preventing dishing.

U.S. Pat. No. 6,679,929 teaches a polishing composition comprising the following components (a) to (g): (a) at least one abrasive selected from the group consisting of silicon dioxide, aluminum oxide, cerium oxide, zirconium oxide and titanium oxide; (b) an aliphatic carboxylic acid; (c) at least one basic compound selected from the group consisting of an ammonium salt, an alkali metal salt, an alkaline earth metal salt, an organic amine compound and a quaternary ammonium salt; (d) at least one polishing accelerating compound selected from the group consisting of citric acid, oxalic acid, tartaric acid, glycine, a-alanine and histidine; (e) at least one anticorrosive selected from the group consisting of benzotriazole, benzimidazole, triazole, imidazole and tolyltriazole; (f) hydrogen peroxide, and (g) water.

U.S. Pat. No. 6,440,186 teaches a polishing composition comprising: (a) an abrasives; (b) a compound to form a chelate with copper ions; (c) a compound to provide a protective layer-forming function to a copper layer; (d) hydrogen peroxide; and (e) water, wherein the abrasive of component (a) has a primary particle size within a range of from 50 to 120 nm.

U.S. Pat. No. 6,838,016 discloses a polishing composition comprising the following components (a) to (g): (a) an abrasive which is at least one member selected from the group consisting of silicon dioxide, aluminum oxide, cerium oxide, zirconium oxide and titanium oxide, (b) a polyalkyleneimine, (c) at least one member selected from the group consisting of guinaldic acid and its derivatives, (d) at least one member selected from the group consisting of glycine, α-alanine, histidine and their derivatives, (e) at least one member selected from the group consisting of benzotriazole and its derivatives, (f) hydrogen peroxide, and (g) water.

US patent application No. 2007/0167017 A1 provides a metal-polishing liquid that comprises an oxidizing agent, an oxidized-metal etchant, a protective film-forming agent, a dissolution promoter for the protective film-forming agent, and water. The application also teaches a method for producing it; and a polishing method of using it. Also provided are materials for the metal-polishing liquid, which include an oxidized-metal etchant, a protective film-forming agent, and a dissolution promoter for the protective film-forming agent.

US 2009/0156006 discloses a chemical-mechanical polishing (CMP) composition suitable for polishing semi-conductor materials. The composition comprises an abrasive, an organic amino compound, an acidic metal complexing agent and an aqueous carrier. A CMP method for polishing a surface of a semiconductor material utilizing the composition is also disclosed.

US2010/0081279 teaches an effective method for forming through-base wafer vias in the fabrication of stacked devices is described. The base wafer can be a silicon wafer in which case the method relates to TSV (through-silicon via) technology. The method affords high removal rates of both silicon and metal (e.g., copper) under appropriate conditions and is tunable with respect to base wafer material to metal selectivity.

As industry standards trend toward smaller device features, there is a continuous developing for copper and TSV CMP slurries.

Thus, there is still a significant need for CMP slurries that deliver superior planarization with high and tunable removal rates and low defects when polishing bulk copper layers of the nanostructures of IC chips.

The copper and TSV CMP slurry composition described herein satisfies the need for providing high, tunable, effective polishing at desired and high polishing rates for polishing copper films with low defects and high planarization efficiency.

BRIEF SUMMARY OF THE INVENTION

In one aspect, the invention provides a copper and TSV chemical mechanical polishing (CMP) slurry composition comprises:
- a) an abrasive;
- b) a chelating agent;
- c) a corrosion inhibitor;
- d) choline salt as copper removal rate booster and total defect reducer;
- e) an organic amine;
- f) an oxidizer;
- g) biocide;
- h) remaining is substantially liquid carrier;

wherein pH of the polishing slurry composition is between 5.0 to 8.0.

In another aspect, the invention provides a method of chemical mechanical polishing a removal material of copper or copper-containing material from a surface of a semiconductor substrate comprising steps of:
- a) providing a polishing pad;
- b) providing a chemical mechanical polishing slurry composition comprising
  - 1) an abrasive;
  - 2) a chelating agent;
  - 3) a corrosion inhibitor;
  - 4) choline salt as copper removal rate booster and total defect reducer;
  - 5) an organic amine;
  - 6) an oxidizer;
  - 7) biocide;
  - 8) remaining is substantially liquid carrier;

wherein pH of the polishing slurry composition is between 5.0 to 8.0;
- c) contacting the surface of the semiconductor substrate with the polishing pad and the chemical mechanical polishing slurry composition; and
- d) polishing the surface of the semiconductor substrate;

wherein at least a portion of the surface that containing the removal material is in contact with both the polishing pad and the chemical mechanical polishing slurry composition.

In yet another aspect, the invention provides a method of a selective chemical mechanical polishing comprising steps of:
- a) providing a semiconductor substrate having a surface containing copper metal films;
- b) providing a polishing pad;
- c) providing a chemical mechanical polishing slurry composition comprising
  - 1) an abrasive;
  - 2) a chelating agent;
  - 3) a corrosion inhibitor;
  - 4) choline salt as copper removal rate booster and total defect reducer;
  - 5) an organic amine;
  - 6) an oxidizer;
  - 7) biocide;
  - 8) remaining is substantially liquid carrier;
  - wherein pH of the polishing slurry composition is between 5.0 to 8.0;
- d) contacting the surface of the semiconductor substrate with the polishing pad and the chemical mechanical polishing slurry composition; and
- e) polishing the surface of the semiconductor substrate to selectively remove the first material;
  - wherein at least a portion of the surface containing the first material is in contact with both the polishing pad and the chemical mechanical polishing slurry composition.

The CMP slurry compositions can further comprise a pH buffering agent; surfactant; and a biocide.

DETAILED DESCRIPTION OF THE INVENTION

Figure 1:
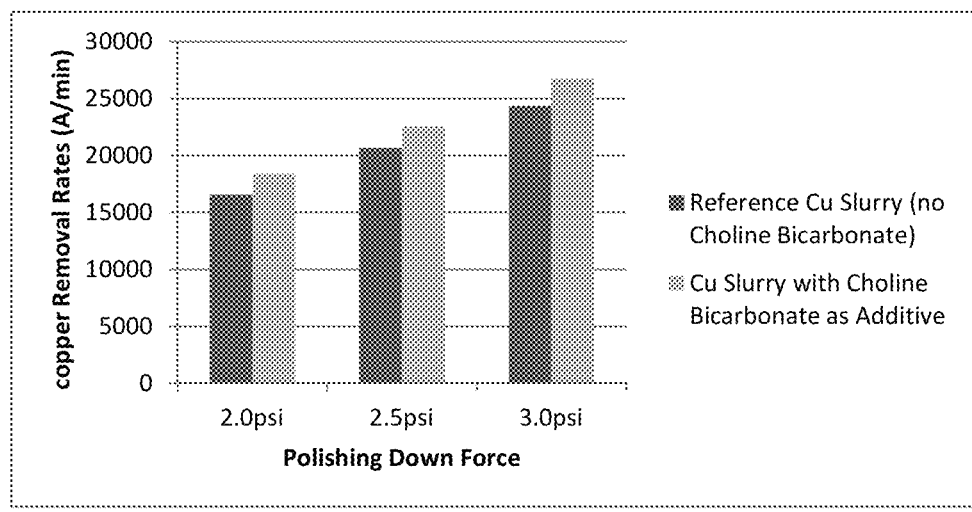
FIG. 1 shows Cu removal rates using CMP slurry compositions with or without choline bicarbonate added as the chemical additive.

The copper and TSV CMP slurry compositions and methods described herein satisfies the need for tunable, high removal rates, low defects, and good planarization efficiency when used to polish copper films.

The CMP slurry composition disclosed herein comprises colloidal silica particles, high purity and nano-sized abrasives; chemical additives comprising choline salts used as copper film removal rate boosting and defect reducing agent; suitable chelating agents and surface wetting agents; corrosion inhibitors to protect copper film surface from further corrosion; organic amine compounds as copper removal rates boosters; oxidizing agents, and liquid carriers, such as water.

The CMP polishing slurry composition can further comprise pH adjusting agents, surfactants, and biocide.

The pH of the slurry composition is from about 5.0 to about 8; preferably from about 5.5 to 7.5; more preferably 6.5 to 7.

Abrasive particles used for the CMP polishing slurry compositions include, but are not limited to, colloidal silica particles doped by other metal oxide within lattice of the colloidal silica, such as alumina doped silica particles, colloidal aluminum oxide, which include alpha-, beta-, and gamma-, and other types of aluminum oxides, colloidal and photoactive titanium dioxide, cerium oxide, colloidal cerium oxide, nano-sized diamond particles, nano-sized silicon nitride particles, mono-modal, bi-modal, multi-modal colloidal abrasive particles, zirconium oxide, organic polymer-based soft abrasives, surface-coated or modified abrasives, and mixtures thereof. The colloidal silica particles can have narrow or broad particle size distributions, with various sizes and different shapes. The shapes of the abrasives include spherical shape, cocoon shape, aggregate shape and other shapes.

The CMP polishing slurry compositions contain from 0.0 wt % to 25 wt % abrasives; preferably from 0.001 wt % to 1 wt %, and more preferably from 0.0025 wt % to 0.1 wt %.

The suitable chemical additives comprising choline salts in the CMP polishing slurry compositions have a general molecular structure shown below:

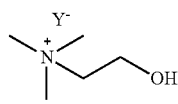

Where, anion Y⁻ can be bicarbonate, hydroxide, p-toluene-sulfonate, bitartrate, and other suitable anionic counter ions.

The suitable chemical additives comprising choline salts in the CMP polishing slurry compositions include choline bicarbonate, and all other salts formed between choline and other anionic counter ions.

The CMP polishing slurry compositions contain from 0.0001 wt % to 0.50 wt % choline salts; preferably from 0.0010 wt % to 0.10 wt % and more preferably from 0.0025 wt % to 0.050 wt %

The selected and suitable chelating agents include glycine, other amino acids, and amino acid derivatives.

The CMP polishing slurry compositions contain from is from 0.01 wt % to 22 wt % chelating agent; preferably from 0.025 wt % to 20 wt %. The more preferred concentration range of the chelating agent is from 0.05 wt % to 16 wt %.

The selected and suitable corrosion inhibitors used for the CMP polishing slurry compositions include, but are not limited to, triazole and its derivatives, benzene triazole and its derivatives. The triazole derivatives include, but not limited to, amino-substituted triazole compounds, bi-amino-substituted triazole compounds.

The concentration range of the corrosion inhibitor is from 0.001 wt % to 0.15 wt %. The preferred concentration range of the corrosion inhibitor is from 0.0025 wt % to 0.1 wt %. The more preferred concentration range of the corrosion inhibitor is from 0.005 wt % to 0.05 wt %.

Organic amine compounds used to boost copper film removal rates include ethylene diamine, propylene diamine, other organic diamine compounds, and organic amine compounds containing multi amino groups in the same molecular framework.

The CMP polishing slurry compositions contain from 0.0001 wt % to 0.20 wt % amine compounds; preferably from 0.0010 wt % to 0.10 wt % and more preferably from 0.0025 wt % to 0.050 wt %.

Oxidizers used for the CMP polishing slurry compositions include, but are not limited to, periodic acid, hydrogen peroxide, potassium iodate, potassium permanganate, ammonium persulfate, ammonium molybdate, ferric nitrate, nitric acid, potassium nitrate, and mixtures thereof.

The preferred oxidizer is hydrogen peroxide.

The CMP polishing slurry compositions contain from 0.01 wt % to 10 wt % oxidizers; preferably from 0.25 wt % to 4 wt %, and more preferably from 0.5 wt % to 2 wt %.

pH adjusting agents used for the CMP polishing slurry compositions include, but are not limited to, nitric acid, hydrochloric acid, sulfuric acid, phosphoric acid, other inorganic or organic acids, and mixtures thereof.

The preferred pH adjusting agent is nitric acid.

The CMP polishing slurry compositions contain from 0.01 wt % to 0.5 wt % pH adjusting agent; preferably from 0.05 wt % to 0.15 wt %.

In certain embodiments, a surfactant is added to the polishing composition as surface wetting agent. The suitable surfactant compounds that may be added to the polishing composition as surface wetting agent include but are not limited to, for example, any of the numerous nonionic, anionic, cationic or amphoteric surfactants known to those skilled in the art.

The following four types of surfactants can be used as disclosed herein copper

CMP slurry as surface wetting agents:

a). non-ionic surface wetting agents, these agents typically are oxygen- or nitrogen-containing compounds with various hydrophobic and hydrophilic moieties in the same molecules, the molecular weight ranges from several hundreds to over 1 million. The viscosities of these materials also possess a very broad distribution.

b). anionic surface wetting agents, these compounds possess the negative net charge on major part of molecular frame, these compound include, but not limited to the following salts with suitable hydrophobic tails, such as alkyl carboxylate, alkyl sulfate, alkyl phosphate, alkyl bicarboxylate, alkyl bisulfate, alkyl biphosphate, such as alkoxy carboxylate, alkoxy sulfate, alkoxy phosphate, alkoxy bicarboxylate, alkoxy bisulfate, alkoxy biphosphate, such as substituted aryl carboxylate, substituted aryl sulfate, substituted aryl phosphate, substituted aryl bicarboxylate, substituted aryl bisulfate, substituted aryl biphosphate etc. The counter ions for this type of surface wetting; agents include, but not limited to the following ions, such as potassium, ammonium and other positive ions. The molecular weights of these anionic surface wetting agents range from several hundred to several hundred-thousands.

c). cationic surface wetting agents, these compounds possess the positive net charge on major part of molecular frame, these compound include, but not limited to, the following salts with suitable hydrophobic tails, such as carboxylate, sulfate, phosphate, bicarboxylate, bisulfate, biphosphate, etc. The counter ions for this type of surface wetting agents include, but not limited to, the following ions, such as potassium, ammonium and other positive ions. The molecular weights of these anionic surface wetting agents range from several hundred to several hundred-thousands.

d). ampholytic surface wetting agents, these compounds possess both of positive and negative charges on the main molecular chains and with their relative counter ions. The examples of such bipolar surface wetting agents include, but not limited to, the salts of amino-carboxylic acids, amino-phosphoric acid, and amino-sulfonic acid.

The CMP polishing slurry compositions contain from 0.00 wt % to 1.0 wt % surfactants; preferably from 0.0001 wt % to 0.25 wt % and more preferably from 0.0005 wt % to 0.10 wt %.

In some embodiments, the surfactant(s) are nonionic, anionic, or mixtures thereof and are present in a concentration ranging about 1 ppm to about 1,000 ppm of the total weight of the slurry.

Biocide used in the CMP polishing slurry compositions is the commercial available Kathon type of biocides.

The CMP polishing slurry compositions contain from 0.0001 wt % to 0.05 wt % biocide; preferably from 0.0001 wt % to 0.025 wt % and more preferably from 0.0002 wt % to 0.01 wt %.

EXPERIMENTAL SECTION

General Experimental Procedure

The associated methods described herein entail use of the aforementioned copper or TSV CMP polishing slurry composition for chemical mechanical planarization of substrates comprised of copper. In the methods, a substrate (e.g., a wafer with copper surface) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing slurry composition is applied (usually continuously) on the pad during copper CMP processing to effect the removal of material to planarize the substrate.

All percentages are weight percentages unless otherwise indicated. In the examples presented below, CMP experiments were run using the procedures and experimental conditions given below. The CMP tool that was used in the examples is a Mirra®, manufactured by Applied Materials, 3050 Boweres Avenue, Santa Clara, Calif., 95054. An IC-1010 pad or other pad, supplied by Dow Chemicals or Fujibo, was used on the platen for the blanket copper wafer polishing studies. Other polishing pads, supplied by Dow Chemicals or Fujibo were also used on the platen for the blanket copper wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by Planarization Platform of Air Products Chemicals Inc. at baseline conditions. Polishing experiments were conducted using blanket copper wafer with 15K Angstroms in thickness. These copper blanket wafers were purchased from Silicon Valley Microelectronics, 1150 Campbell Ave, Calif., 95126.

Parameters

Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: polishing slurry composition flow, ml/min Removal Rates, Defectivity, and Selectivity Copper RR 2.0 psi Measured copper removal rate at 2.0 psi down pressure of the CMP tool
Copper RR 2.5 psi Measured copper removal rate at 2.0 psi down pressure of the CMP tool and total defects measured by SP2.
Copper RR 3.0 psi Measured copper removal rate at 3.0 psi down pressure of the CMP tool
Ta RR 3.0 psi Measured Ta removal rate at 3.0 psi down pressure of the CMP tool
TaN RR 3.0 psi Measured TaN removal rate at 3.0 psi down pressure of the CMP tool
Ti RR 3.0 psi Measured Ti removal rate at 3.0 psi down pressure of the CMP tool
TiN RR 3.0 psi Measured TiN removal rate at 3.0 psi down pressure of the CMP tool
Si RR 3.0 psi Measured Si removal rate at 3.0 psi down pressure of the CMP tool
Selectivity is calculated of Cu removal rates divided by other film removal rates at 3 psi down force.

Total Defect Counts: Collected on the copper blanket wafers polished by using disclosed herein copper and TSV CMP polishing slurry compositions at 2.5 psi down force.

Working Example

In the working examples, Polishing pad, IC1010 and other polishing pads were used during CMP, supplied by Dow Chemicals or Fujibo.

The high purity and nano-sized colloidal silica particles were prepared from TMOS or TEOS.

Amino acid, glycine, was used as the chelating agent, ethylenediamine was used as copper film removal rate boosting agent, kathon CG was used as biocide, 3-amino-1,2,4-triazole was used as corrosion inhibitor, hydrogen peroxide was used as oxidizing agent; and choline bicarbonate was used as removal rate boosting and defect reducing agent, pH was between 6.5-7.5.

Experiments were conducted using CMP slurry compositions with and without choline bicarbonate as the removal rate boosting and defect reducing agent. The polishing performances were compared.

The removal rates results of using choline bicarbonate in the CMP slurry composition on copper film at three different down forces were listed in Table 1.

As the results shown in Table 1, with the use of choline bicarbonate as the chemical additive in the copper CMP slurry composition, the copper film removal rates were increased by 11 wt % at 2.0 psi down force, 9 wt % at 2.5 psi down force, and about 10 wt % at 3.0 psi down force respectively. In overall, the copper film removal rates were increased by about 10 wt % at different applied down forces. The averaged about 10 wt % increase in copper film removal rate is significant while considering the copper CMP slurry composition being used as reference already afforded very high copper film removal rates.

TABLE 1

Copper CMP Slurries with/or without Choline Bicarbonate as Additive on Cu Removal Rates

| Cu Slurry composition Samples | Removal Rate (A/min.) at 2.0 psi | Removal Rate (A/min.) at 2.5 psi | Removal Rate (A/min.) at 3.0 psi |
|---|---|---|---|
| Reference Cu Slurry composition (no Choline Bicarbonate) | 16563 | 20676 | 24340 |
| Cu Slurry composition (with Choline Bicarbonate as additive) | 18386 | 22540 | 26741 |
| Removal Rate Change | +11% | +9% | About +10% |

Furthermore, it is important to observe the reduction in total defects when choline bicarbonate was used as the chemical additive in the CMP polishing slurry compositions. The results of the impact of using choline bicarbonate as the chemical additive on the total defects were listed in Table 2.

TABLE 2

Total Defects of Copper CMP Slurries with/or without Choline Bicarbonate as Additive

| Cu Slurry composition Samples | Total Defects by SP2 | Total Defect Reduction |
|---|---|---|
| Reference Cu Slurry composition (no Choline Bicarbonate) | 429 | — |
| Cu Slurry composition (with Choline Bicarbonate as additive) | 78 | about 550% |

As the results shown in Table 2, with the use of choline bicarbonate as the chemical additive in the copper CMP slurry composition, the total defects were reduced from 429 for the reference copper CMP slurry composition without using choline bicarbonate to 78 for the copper CMP slurry composition using choline bicarbonate as the chemical additive. This represents over 5 times more reduction in total defects. As a general matter, it is extremely important to reduce total defects when copper CMP slurry composition is selected and used for polishing copper films in copper CMP or TSV CMP processes.

Figure 2:
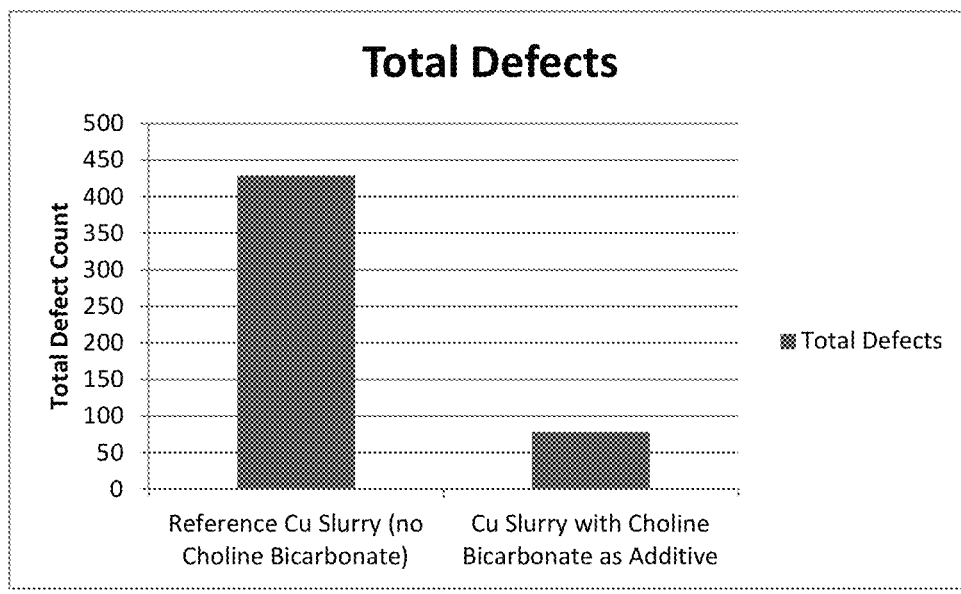
FIG. 2 shows total defect counts using CMP slurry compositions with or without choline bicarbonate added as the chemical additive.

The impacts of choline bicarbonate as copper film removal rate boosting agent and defect reducing agent were also depicted in FIG. 1 and FIG. 2 respectively.

Figure 3:
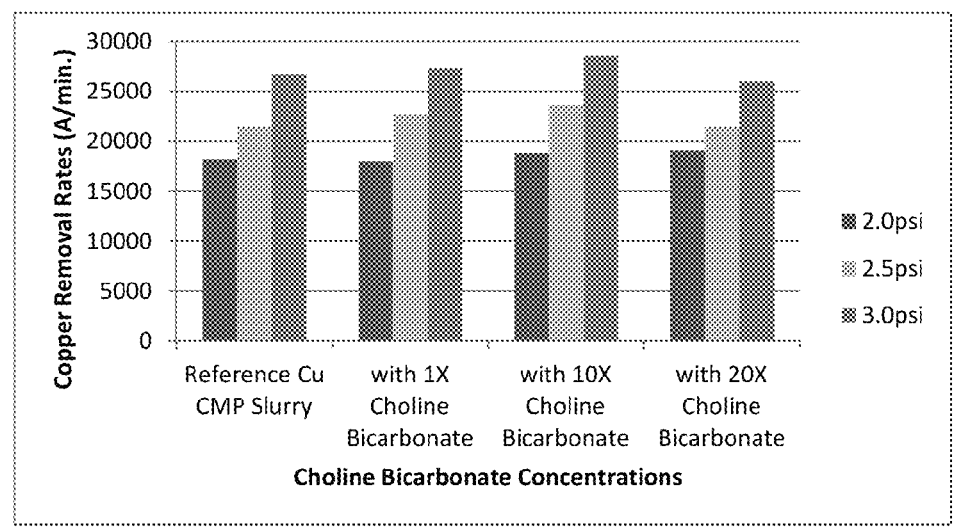
FIG. 3 shows Cu removal rates using CMP slurry compositions with choline bicarbonate added as the chemical additive at different concentrations.

The impacts of the concentrations of chemical additive, choline bicarbonate, in the copper CMP slurry composition on the copper film removal rates at different down forces were also studied. The results are listed in Table 3 and FIG. 3 respectively.

TABLE 3

Impacts of Choline Bicarbonate Concentrations in Copper CMP Slurries on Cu Removal Rates.

| Cu Slurry composition Samples | Removal Rate (A/min.) at 2.0 psi | Removal Rate (A/min.) at 2.5 psi | Removal Rate (A/min.) at 3.0 psi |
|---|---|---|---|
| Reference Cu Slurry composition (no Choline Bicarbonate) | 18184 | 21467 | 26677 |
| Cu Slurry composition (with 1X Choline Bicarbonate as additive) | 18025 | 22692 | 27320 |
| Cu Slurry composition (with 10X Choline Bicarbonate as additive) | 18823 | 23624 | 28549 |
| Cu Slurry composition (with 20X Choline Bicarbonate as additive) | 19071 | 21432 | 25988 |
| Removal Rate Change | Up to +4.9% | Up to +10% | About +7% |

As the results shown in Table 3, in general, copper film removal rates were increased more at 10× concentrated bicarbonate than the concentrations at 1× or 20×, respectively.

At 10× concentrated Choline Bicarbonate concentration, the copper film removal rate increased % seems higher than that at 20× concentrated Choline Bicarbonate concentration. This might be attributed to the fact 10× concentration of choline bicarbonate as additive in the disclosed Cu CMP slurry here afforded the optimized removal rate boosting effect than the 20× concentration of choline bicarbonate.

The polishing selectivity for copper and other materials such as Ta, TaN, Ti, TiN and Si have also been measured. The selectivity results were listed in Table 4, when 3 psi down force was used for polishing. The ratio of the removal rate of copper to the removal rate of dielectric base is called the "selectivity" for removal of copper in relation to dielectric during CMP processing of substrates comprised of titanium, titanium nitride, tantalum, tantalum nitride, and silicon.

TABLE 4

Selective of Cu vs. Other Films

| Cu:Ta | Cu:TaN | Cu:Ti | Cu:TiN | Cu:Si |
|---|---|---|---|---|
| 1250 | 5000 | 1389 | 397 | 253 |

As the data showed in Table 4, very high selectivity (>1000) was achieved for Cu:Ta, Cu:TaN, and Cu:Ti, and also reasonable high selectivity was achieved for Cu:TiN and Cu:Si (>250). This high selectivity for polishing copper relative to the other materials is highly desirable for many applications, such as, TSV applications, that demands high copper film removal rates.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A method of chemical mechanical polishing a removal material of copper or copper-containing material from a surface of a semiconductor substrate comprising steps of:
   a) providing a polishing pad;
   b) providing a chemical mechanical polishing slurry composition comprising
      1) from 0.0 wt % to 25 wt % abrasive;
      2) from 0.01 wt % to 22 wt % chelating agent;
      3) from 0.001 wt % to 0.15 wt % corrosion inhibitor;
      4) from 0.0001 wt % to 0.50 wt % choline salt;
      5) from 0.0001 wt % to 0.20 wt % organic amine;
      6) from 0.01 wt % to 10 wt % oxidizer;
      7) from 0.0001 wt % to 0.05 wt % biocide;
      8) remaining is substantially liquid carrier;
   wherein pH of the polishing slurry composition is between 5.0 to 8.0; and
   the choline salt having a general molecular structure shown below:

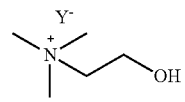

wherein anion Y⁻ is selected from the group consisting of bicarbonate, p-toluenesulfonate, bitartrate, and combinations thereof;
   c) contacting the surface of the semiconductor substrate with the polishing pad and the chemical mechanical polishing slurry composition; and
   d) polishing the surface of the semiconductor substrate;
   wherein at least a portion of the surface that containing the removal material is in contact with both the polishing pad and the chemical mechanical polishing slurry composition.

2. The method of claim 1, wherein the abrasive is selected from the group consisting of colloidal silica particles, alumina doped silica particles, colloidal aluminum oxide, colloidal and photoactive titanium dioxide, cerium oxide, colloidal cerium oxide, nano-sized diamond particles, nano-sized silicon nitride particles, mono-modal, bi-modal, multi-modal colloidal abrasive particles, zirconium oxide, organic polymer-based soft abrasives, surface-coated or modified abrasives, and mixtures thereof; the abrasive having narrow or broad particle size distributions, with various sizes and different shapes selected from the group consisting of spherical shape, cocoon shape, aggregate shape and combinations thereof; the chelating agent is selected from the group consisting of glycine, amino acids, and amino acid derivatives; the corrosion inhibitor is selected from the group consisting of triazole and its derivatives, benzene triazole and its derivatives; the organic amine compound agent is selected from the group consisting of ethylene diamine, propylene diamine, organic amine compounds containing multi amino groups in the same molecular framework; the oxidizer is selected from the group consisting of periodic acid, hydrogen peroxide, potassium iodate, potassium permanganate, ammonium persulfate, ammonium molybdate, ferric nitrate, nitric acid, potassium nitrate, and mixtures thereof; and the liquid carrier is water.

3. The method of claim 2, wherein the triazole derivative is selected from the group consisting of amino-substituted triazole compounds, bi-amino-substituted triazole compounds, and mixtures thereof.

4. The method of claim 1, wherein the chemical mechanical polishing slurry composition further comprising one selected from the group consisting of from 0.01 wt % to 0.5 wt % pH adjusting agent comprising inorganic or organic acids; from 0.00 wt % to 1.0 wt % surfactant; and combinations thereof; wherein:
the pH adjusting agent is selected from the group consisting of nitric acid, hydrochloric acid, sulfuric acid, phosphoric acid, and mixtures thereof; and the surfactant is nonionic, anionic, cationic or amphoteric surfactant.

5. The method of claim 1, wherein the chemical mechanical polishing slurry composition comprising nano-sized colloidal silica particles prepared from TMOS or TEOS; glycine; ethylenediamine, 3-amino-1,2,4-triazole, hydrogen peroxide; choline bicarbonate; and the pH is 6.5 to 7.5.

6. The method of claim 1, wherein the semiconductor substrate further comprising one selected from the group consisting of Ta, TaN, Ti, TiN, Si and combinations thereof; and the chemical mechanical polishing slurry composition has polishing selectivity of Cu:Ta, Cu:TaN, Cu:Ti Cu:TiN and Cu:Si ranging from about 200 to about 5000.

7. A method of a selective chemical mechanical polishing comprising steps of:
a) providing a semiconductor substrate having a surface containing copper metal;
b) providing a polishing pad;
c) providing a chemical mechanical polishing slurry composition comprising
1) from 0.0 wt % to 25 wt % abrasive;
2) from 0.01 wt % to 22 wt % chelating agent;
3) from 0.001 wt % to 0.15 wt % corrosion inhibitor;
4) from 0.0001 wt % to 0.50 wt % choline salt;
5) from 0.0001 wt % to 0.20 wt % organic amine;
6) from 0.01 wt % to 10 wt % oxidizer;
7) from 0.0001 wt % to 0.05 wt % biocide;
8) remaining is substantially liquid carrier;
wherein pH of the polishing slurry composition is between 5.0 to 8.0; and
the choline salt having a general molecular structure shown below:

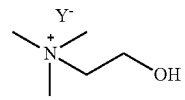

wherein anion Y⁻ is selected from the group consisting of bicarbonate, p-toluenesulfonate, bitartrate, and combinations thereof;
d) contacting the surface of the semiconductor substrate with the polishing pad and the chemical mechanical polishing slurry composition; and
e) polishing the surface of the semiconductor substrate to selectively remove copper metal;
wherein at least a portion of the surface containing copper metal is in contact with both the polishing pad and the chemical mechanical polishing slurry composition.

8. The method of claim 7, wherein the abrasive is selected from the group consisting of colloidal silica particles, alumina doped silica particles, colloidal aluminum oxide, colloidal and photoactive titanium dioxide, cerium oxide, colloidal cerium oxide, nano-sized diamond particles, nano-sized silicon nitride particles, mono-modal, bi-modal, multi-modal colloidal abrasive particles, zirconium oxide, organic polymer-based soft abrasives, surface-coated or modified abrasives, and mixtures thereof; the abrasive having narrow or broad particle size distributions, with various sizes and different shapes selected from the group consisting of spherical shape, cocoon shape, aggregate shape and combinations thereof; the chelating agent is selected from the group consisting of glycine, amino acids, and amino acid derivatives; the corrosion inhibitor is selected from the group consisting of triazole and its derivatives, benzene triazole and its derivatives; the organic amine compound agent is selected from the group consisting of ethylene diamine, propylene diamine, organic amine compounds containing multi amino groups in the same molecular framework; the oxidizer is selected from the group consisting of periodic acid, hydrogen peroxide, potassium iodate, potassium permanganate, ammonium persulfate, ammonium molybdate, ferric nitrate, nitric acid, potassium nitrate, and mixtures thereof; and the liquid carrier is water.

9. The method of claim 8, wherein the triazole derivative is selected from the group consisting of amino-substituted triazole compounds, bi-amino-substituted triazole compounds, and mixtures thereof.

10. The method of claim 7, wherein the chemical mechanical polishing slurry composition further comprising one selected from the group consisting of from 0.01 wt % to 0.5 wt % pH adjusting agent comprising inorganic or organic acids; from 0.00 wt % to 1.0 wt % surfactant; and combinations thereof; wherein:
the pH adjusting agent is selected from the group consisting of nitric acid, hydrochloric acid, sulfuric acid, phosphoric acid, and mixtures thereof; and the surfactant is nonionic, anionic, cationic or amphoteric surfactant.

11. The method of claim 7, wherein the chemical mechanical polishing slurry composition comprising nano-sized colloidal silica particles prepared from TMOS or TEOS; glycine;

ethylenediamine, 3-amino-1,2,4-triazole, hydrogen peroxide; and choline bicarbonate; the pH is 6.5 to 7.5; the semiconductor substrate further comprising one selected from the group consisting of Ta, TaN, Ti, TiN, Si and combinations thereof; and the chemical mechanical polishing slurry composition has polishing selectivity of Cu:Ta, Cu:TaN, Cu:Ti Cu:TiN and Cu:Si ranging from about 200 to about 5000.

* * * * *